United States Patent [19]

Weiss et al.

[11] 4,406,010
[45] Sep. 20, 1983

[54] RECEIVER FOR CVSD MODULATION WITH INTEGRAL FILTERING

[75] Inventors: David L. Weiss, Roselle; Eric F. Ziolko, Schaumburg, both of Ill.; Tim A. Williams, Austin, Tex.

[73] Assignee: Motorola, Inc., Schaumburg, Ill.

[21] Appl. No.: 221,189

[22] Filed: Dec. 30, 1980

[51] Int. Cl.³ ............................................. H03K 13/22
[52] U.S. Cl. ................................... 375/32; 332/11 D; 364/724
[58] Field of Search ..................... 375/28–32; 370/7; 364/724; 332/11 D; 455/72; 360/65; 333/14

[56] References Cited

U.S. PATENT DOCUMENTS

| | | | |
|---|---|---|---|
| 3,857,111 | 12/1974 | Deschenes et al. | 375/32 |
| 3,878,465 | 4/1975 | Stephenne et al. | 375/32 |
| 3,899,754 | 8/1975 | Brolin | 375/32 |
| 4,035,724 | 7/1977 | Stephenne et al. | 375/32 |
| 4,044,306 | 8/1977 | Villeret et al. | 340/347 DD |
| 4,151,517 | 4/1979 | Kelley | 375/28 |
| 4,233,684 | 11/1980 | Eggermont | 375/30 |
| 4,264,974 | 4/1981 | Crouse | 375/32 |

Primary Examiner—Benedict V. Safourek
Assistant Examiner—Stephen Chin
Attorney, Agent, or Firm—Rolland R. Hackbart; James W. Gillman; Edward M. Roney

[57] ABSTRACT

CVSD modulation is detected by applying a digital signal containing CVSD information to a digital filter that is in the CVSD loop that includes a syllabic filter and a rule circuit. The digital filter includes voltage-operated switches that switch one of two voltages to a resistor network and thereby combine multiplication and digital filtering. The output of the digital filter is the output of the circuit.

4 Claims, 4 Drawing Figures

RECEIVER FOR CVSD MODULATION WITH INTEGRAL FILTERING

BACKGROUND OF THE INVENTION

This invention relates to the detection of audio signals from input pulses that have been encoded with continuously-variable-slope delta (CVSD) modulation. In particular, it is an improved CVSD modulator that is especially adapted for use in integrated circuits using complementary metal-oxide semiconductors.

CVSD modulation is a well-known scheme for converting analog signals to digital form. This is a non-linear system in which the direction of the slope error is determined and subjected to a rule. If the slope error is in the same direction for a predetermined number of pulses (the rule), then the system is caused to change the slope of the delta-modulated signal. This system holds the changed slope at the new value until the rule indicates that it is time to change the slope. By this means it is possible to have a continuously adjusted slope that is the minimum amount necessary to follow the audio signal. This maximizes the closeness with which the delta-modulated signal follows the audio signal while at the same time minimizing the amount of pulse noise in that signal. The foregoing statements are well known and are illustrated in a number of references. Two typical such references are a textbook, "Delta Modulation Systems," by R. Steele, and U.S. Pat. No. 4,151,517 entitled "closed Loop Companding Ratio Control for Continuously Variable Slope Delta Modulation," assigned to the assignee of the present invention.

Three different types of noise are characteristic of a CVSD system. They are the idle signal, quantization noise, and beats. The idle signal, is a sawtooth or other periodic wave typically at 6 kHz which is half the bit rate. It is produced by alternating information bits during intervals when there is no signal. Quantization noise is an error signal produced by the difference between the reconstructed signal and the analog signal from which it was derived. Beats are products of input frequencies and the idle frequency. It is common practice to filter out this component and any other components outside the audio bandwidth that are in a CVSD receiver by applying the reconstructed signal to a filter. This is normally done in an analog filter which is placed at a point after the CVSD demodulator where the signal has already been reconstructed into analog form. Removal of the unwanted components from the CVSD process improves intelligibility of the reconstructed signal.

When CVSD modulation is used in a communications receiver, the filter will normally be a low-pass filter with a cutoff at a frequency of the order of 3 kHz. This is a compromise that maximizes voice signals while minimizing distortion. Communications receivers are restricted in bandwidth, which requires a relatively low bit rate for digital signals. This causes the noise components to be in a frequency band that can be heard and hence that will affect intelligibility. The relatively low cutoff frequency will preserve broadcast information while eliminating most of the idle signal, quantization noise, and beats. When such a filter is constructed of analog components, it is difficult and costly to realize. Such a filter must be made of discrete components that tend to be relatively large. Digital filters, on the other hand, can be realized readily in CMOS or other integrated-circuit technologies, but a digital filter would not be satisfactory for placement in a location where the analog signal or an approximation to it has been recovered.

It is an object of the present invention to provide digital filtering in the recovery of a CVSD signal.

It is a further object of the present invention to provide a CVSD receiver with pulse filtering that can be realized on a chip.

Other objects will become apparent in the course of a detailed description of the invention.

SUMMARY OF THE INVENTION

CVSD modulation is detected by applying the digital signal containing CVSD information to a digital filter that is in the receiver loop. The output of the digital filter is monitored by a rule circuit that controls a syllabic filter to generate a signal that is multiplied by the output of the digital filter. The multiplied product is a detected and filtered CVSD signal.

DETAILED DESCRIPTION OF THE INVENTION

Figure 1:
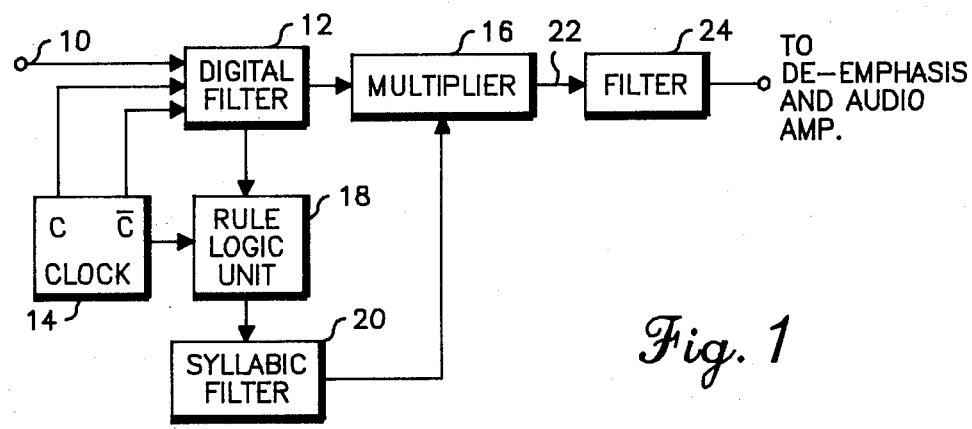
FIG. 1 is a symbolic block diagram of a circuit for the practice of the present invention.

FIG. 1 is a symbolic block diagram of a circuit for the practice of the present invention. In FIG. 1 terminal 10 receives a signal that contains CVSD modulation. For purposes of description, it will be assumed that the CVSD modulation contains information in the audio band. The data rate of the signals is 12 kilobits per second. The signal at terminal 10 is coupled to digital filter 12 which is timed in its action by clock 14. The filtered analog output of digital filter 12 is taken to multiplier 16. An output from digital filter 12 is also taken to rule logic unit 18 which supplies an input to syllabic filter 20. The term "syllabic" is used to denote the fact that syllabic filter 20 has a time constant that is of the order of the lengths of syllables in typical words. The output of syllabic filter 20 as determined by an instruction from the rule logic unit 18 is multiplied by the output of digital filter 12 in multiplier 16 to recreate an approximation on terminal 22 to the audio signal. That signal must be integrated to match the integrator normally present in a CVSD modulator. This may be done either by an integrator 24 or it may be done as an incidental benefit of a de-emphasis circuit that is typically a part of an audio amplifier. The circuit of FIG. 1 is referred to as a CVSD receiver, but it should be noted that such a circuit or its equivalent without a filter is also part of a transmitter that broadcasts signals that have been subjected to CVSD modulation.

Figure 3:
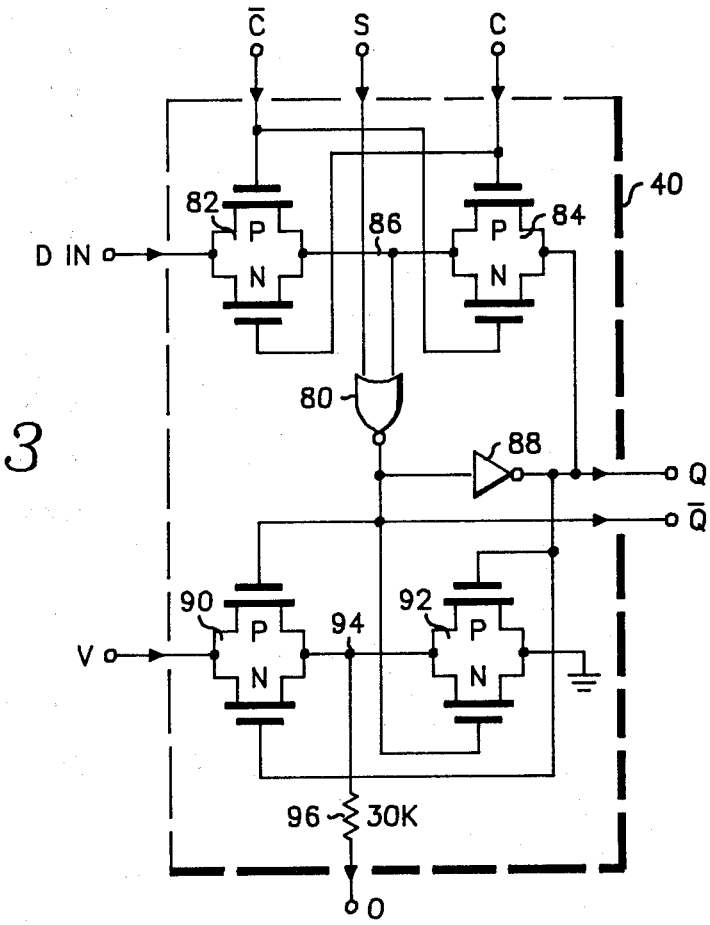
FIG. 3 is a circuit diagram of a flip-flop of FIG. 2.
Figure 2A:
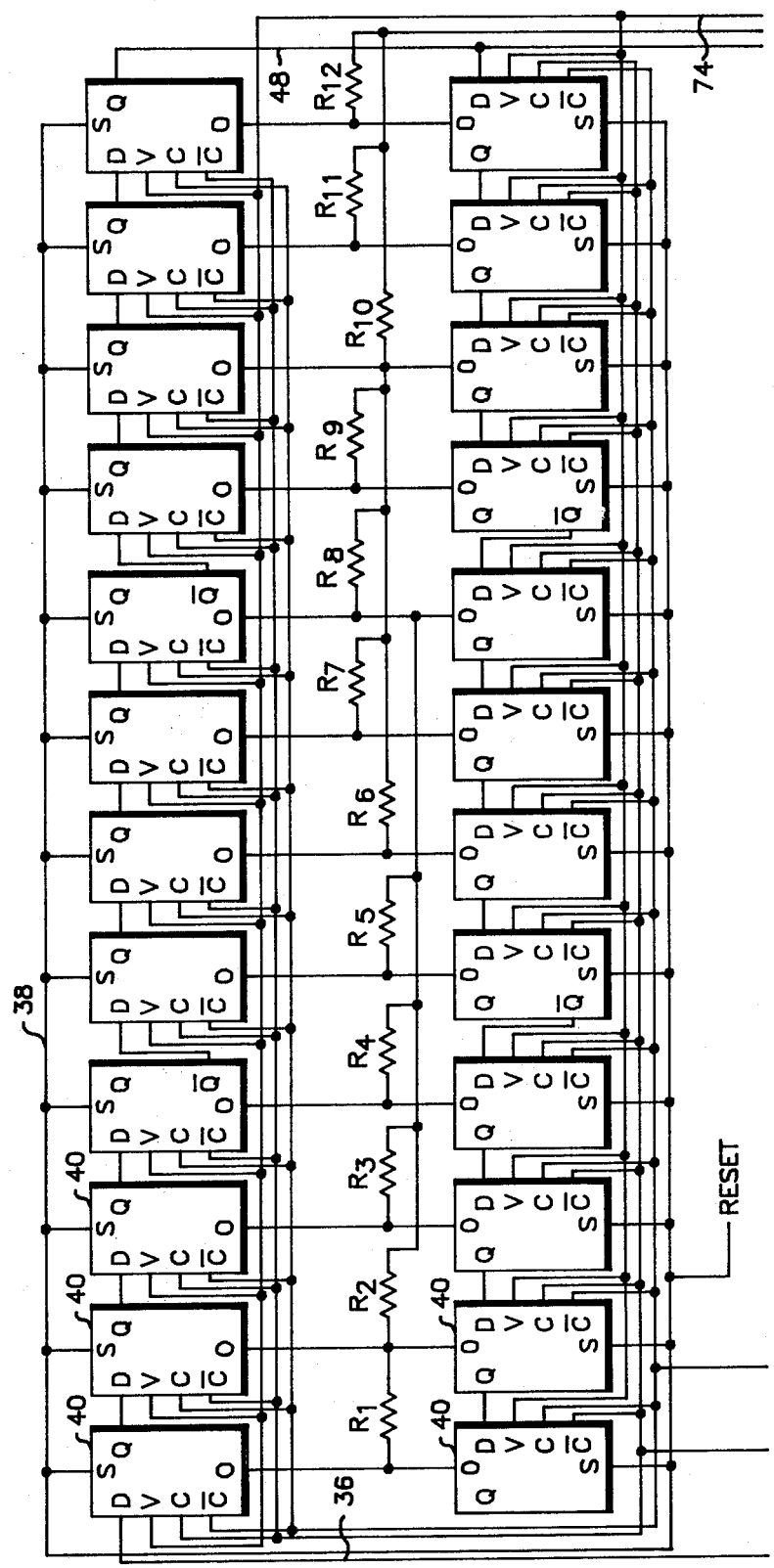
FIGS. 2A and 2B are detailed gate realization of a circuit corresponding to the block diagram of FIG. 1.
Figure 2B:
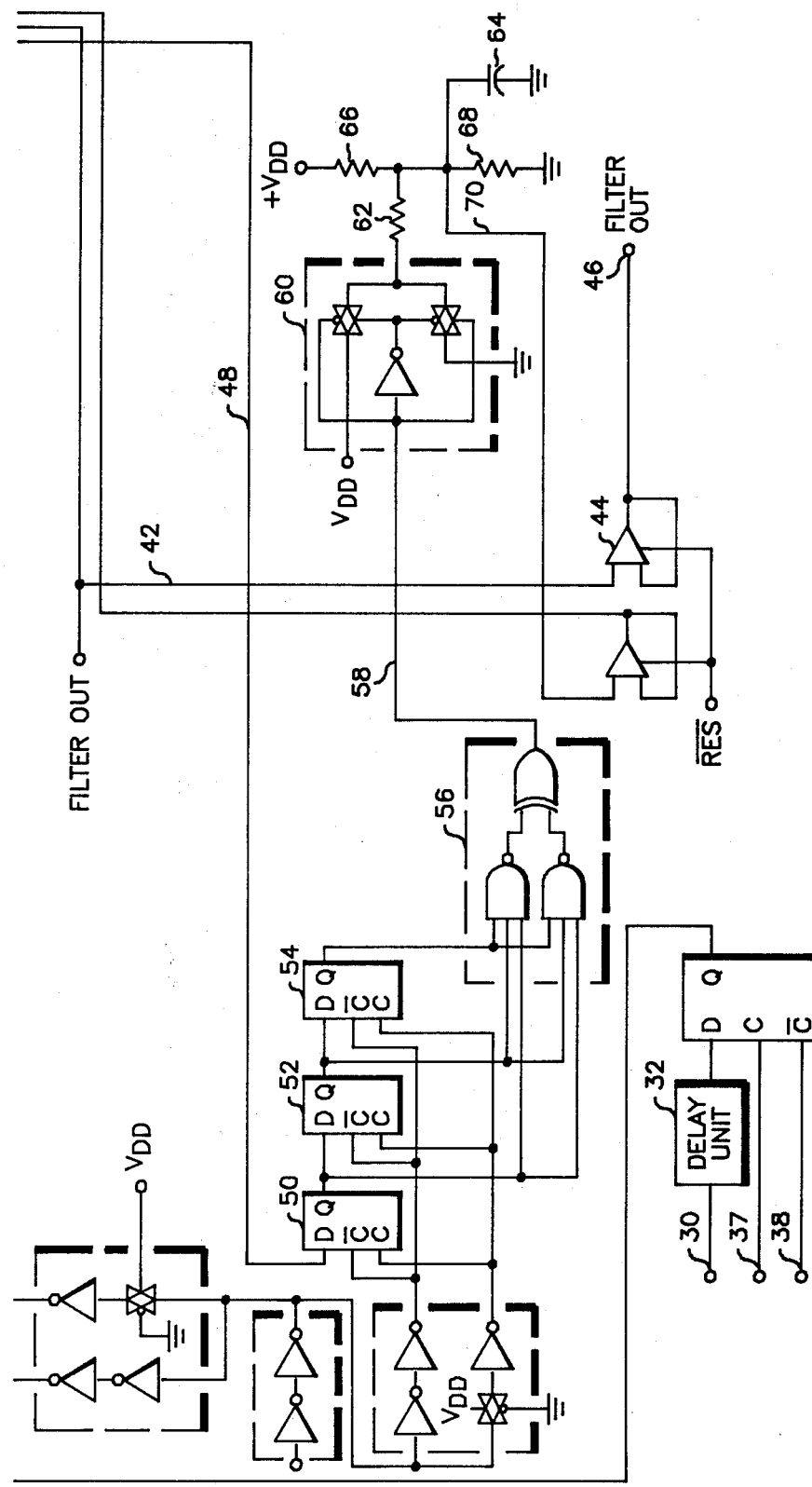

FIGS. 2A and 2B is a circuit diagram of a CVSD receiver incorporating integral filtering, and FIG. 3 is an expanded circuit diagram of a flip-flop unit of FIGS. 2A and 2B. In FIGS. 2A, 2B and 3, a CVSD signal is applied at terminal 30 and is conducted through a delay unit 32 to a reclocking flip-flop 34. Clock pulses of alternate polarities (C and C̄) are also coupled to reclocking flip-flop 34 on lines 37 and 38. Delay unit 32 and reclocking flip-flop 34 are shown because they were used in the circuit as built to supply properly shaped pulses at appropriate times. They are not essential to the practice of the present invention.

A train of pulses from reclocking flip-flop 34 is conducted on line 36 to digital filter 38. Digital filter 38 is a transversal digital filter that comprises a number (in this case, 24) of flip-flops 40 connected in cascade to form a shift register. The connections are either Q to D or $\bar{Q}$ to D depending upon the required algebraic sign. The output (here denoted "O") of the first flip-flop 40 is connected to the corresponding terminal of the last; that of the second, to the next-to-last, and so on. It should be noted that additional resistors are in the flip-flops 40, so this is not a direct electrical connection. In the usual implementation of a digital filter, each of the common points between adjacent delay elements is connected through a resistor to an output terminal of the filter. That connection is modified in digital filter 38 and the resistors denoted $R_1$ through $R_{12}$ are in a series-parallel combination that is calculated to minimize the percentage variation in resistor values. This makes it easier to form resistors $R_1$ through $R_{12}$ on a chip using CMOS techniques. Values of these resistors in the digital filter 38 as constructed are listed in Table I.

TABLE I

| Values of Resistors in Digital Filter 38 | |
|---|---|
| Resistor Number | Resistance in Kilohms |
| 1 | 49.65 |
| 2 | 101.36 |
| 3 | 70.4 |
| 4 | 108 |
| 5 | 56.72 |
| 6 | 95.04 |
| 7 | 55.2 |
| 8 | 54.96 |
| 9 | 62.16 |
| 10 | 63.76 |
| 11 | 64.32 |
| 12 | 44.96 |

In typical digital filters, the voltage at the Q or $\bar{Q}$ terminal of each delay element is applied to the resistive network. This means that in the conventional digital filter, the voltage applied at the flip-flop end of each of the resistors $R_1$ through $R_{12}$ can take on one of two values. However, in the flip-flops 40 of FIG. 2, terminal O is switched alternately to the voltage at terminal V or to ground through a resistor. This effects the multiplication that makes digital filter 38 a multiplying filter. This feature will be described further in an examination of the structure of the flip-flops 40. The filtered and multiplied signal from digital filter 38 is conducted on line 42 to a buffer 44, then to an output terminal 46. A signal at the midpoint of digital filter 38 is taken on line 48 to a flip-flop 50, which with flip-flops 52 and 54 forms a shift register. Outputs from flip-flops 50, 52 and 54 are taken to logic unit 56, which generates a signal on line 58 when flip-flops 50, 52 and 54 are simultaneously in the same logical state. This is the rule logic unit 18 of FIG. 1. The rule that is expressed on line 58 is to make a change if there are three consecutive bits of the same sign. This is the rule logic unit 18 of FIG. 1. The change is effected by transmission gate 60, which is switched to connect voltage $V_{DD}$ to register 62 instead of connecting a ground to resistor 62. In the absence of current flow through resistor 62, capacitor 64 will hold a charge that is determined by resistors 66 and 68 that serve as a voltage divider on voltage $V_{DD}$. Current flow in either direction through resistor 62 changes the voltage on capacitor 64. That voltage is taken on line 70 to buffer 72 vents on line 74 to each terminal V in the flip-flops 40.

FIG. 3 is a gate realization of a flip-flop 40 of FIGS. 2A and 2B. The term "flip-flop" has been used because the circuit of FIG. 3 includes the functions of conventional flip-flops, but it will become apparent from the description of the circuit of FIG. 3 that the circuit performs additional functions. Referring to FIG. 3, an S input is taken as one input to NOR gate 80. This is a set terminal to enable or disable operation of the circuit. Terminals C and $\bar{C}$ are respectively clock and anticlock inputs. Each is connected to transmission gates 82 and 84. Common point 86 of transmission gates 82 and 84 is connected as an input to NOR gate 80, the output of which is taken to terminal $\bar{Q}$ and through inverter 88 to terminal Q. The output of inverter 88 is also connected as an input to transmission gate 84 so that the combination of transmission gates 82 and 84 and inverter 88 comprise a half flip-flop, or a latch, enabled by NOR gate 80. Two of these circuits in cascade become a full flip-flop because of the combined clock and anticlock inputs. Both the Q and $\bar{Q}$ outputs are connected internally to a second set of transmission gates 90 and 92. A common point 94 of transmission gates 90 and 92 is taken through a resistor 96 to output terminal O. When transmission gate 90 is caused by a positive Q signal and a negative $\bar{Q}$ signal to conduct, the voltage V is applied through resistor 96 to output terminal O. Conversely, when transmission gate 92 is caused by a positive $\bar{Q}$ signal and a negative Q signal to conduct, common point 94 is connected to ground and thus resistor 96 is grounded. The logical operation of the circuit of FIG. 3 will become more apparent upon an examination of the truth table for that circuit which is shown in Table II.

TABLE II

| Truth Table for Circuit of FIG. 3 | | | | |
|---|---|---|---|---|
| S | D | C | Q | O |
| 1 | — | — | 1 | GROUND |
| 0 | 0 | 0 | LATCH | UNCHANGED |
| 0 | 0 | 1 | 0 | GROUND |
| 0 | 1 | 0 | LATCH | UNCHANGED |
| 0 | 1 | 1 | 1 | V |

NOTES:
The bar (—) indicates a don't care condition; "LATCH" means Q holds its last previous value; "UNCHANGED" means output terminal O holds its last previous value.

The circuit of FIG. 3 has several differences from the standard transversal digital filter, which comprises successive time delays connected through resistors to the output. These will be discussed below. Well-known techniques are used to determine the number of stages of time delay and to calculate the values of the resistors to provide a desired amount of filtering. The calculational techniques will normally set the minimum desired number of stages to a shift register and establish the clock frequency. In some positions, the design calculations may call for negative signs in implementing the filter. This can be accomplished when the time delays are flip-flops by connecting the resistor that is in the position calling for a negative sign to a $\bar{Q}$ terminal rather than a Q terminal. Alternatively, the same result could be achieved for an individual flip-flop by driving that flip-flop from the $\bar{Q}$ terminal rather than the Q terminal. Such a change repeats the sign change in successive flip-flops. Either of these methods of connecting the shift register is a matter of design choice.

The typical circuit presents three disadvantages that are overcome by the circuit of FIG. 3. First, resistors realized according to well-known calculational methods can be expected to produce resistor values that differ in a ratio of 10:1 or more. Such resistance ratios are difficult to achieve in CMOS technology. An improvement in such a realization is shown in FIG. 3 in which resistors have been placed in series-parallel combinations to bring their maximum ratio of resistances to a factor of approximately 2:1.

A second improvement in the circuit of FIG. 3 results from the fact that the current supplied to the resistors of the typical digital filter is the same current that operates the logical functions of the flip-flops. That current is typically enough to load the flip-flops hampering their operations and that of the filter. The circuit of FIG. 3 overcomes this disadvantage by separating the logical operation of the flip-flop from current handling. Referring to FIG. 3, the flip-flop comprises transmission gates 82 and 84, NOR gate 80 and inverter 88. However, neither the Q nor the $\overline{Q}$ terminal is used as an output to the resistors of a filter. Rather, the Q and $\overline{Q}$ terminals are taken to what is essentially a single-pole double-throw switch that is formed by FET gates 90 and 92. This switch allows the voltage V to supply whatever current is delivered through resistor 96 to the resistors $R_1$ through $R_{12}$ of FIG. 2.

The third feature of the circuit of FIGS. 2 and 3 that differs from the conventional digital filter is the use of a value of voltage V of FIG. 3 that varies within a limited range. In the circuit of FIGS. 2A and 2B, that variable voltage is taken as the output of a syllabic filter. By so switching the output voltage of the syllabic filter, the circuit of FIG. 2 acts as a combined digital filter and multiplier. Referring to FIG. 1, this combines digital filter 12 and multiplier 16 to produce an output at terminal 22 that is, when filtered in filter 24, an audio reconstruction of a cvsd signal. The combination of multiplier and filter is disclosed and claimed in a copending application with an internal serial number of CM-80659, assigned to the assignee of the present invention.

Referring again to FIG. 2, it should be noted that each flip-flop 40 is connected both to a clock pulse (C) and an anticlock pulse ($\overline{C}$). Connections are alternated so that one flip-flop 40 is triggered by a clock pulse and the adjacent one is triggered by a $\overline{C}$ pulse. This doubles the apparent frequency of the operation of the filter of FIG. 2A.

We claim:

1. A CVSD receiver for producing an analog output from a CVSD bit stream comprising:
   (a) a digital filter receiving a bit stream containing CVSD modulation and filtering the bit stream to produce a filtered output;
   (b) a rule logic circuit connected to the digital filter and responsive to the bit stream to generate a signal on the occurence of a predetermined number of consecutive bits of the same polarity;
   (c) a syllabic filter connected to the rule logic circuit to produce a voltage that varies in response to the output of the rule circuit; and
   (d) means for multiplying the voltage produced by the syllabic filter by the filtered output of the digital filter to produce the analog output.

2. The circuit of claim 1 wherein the digital filter comprises a plurality of latches connected to form flip-flops.

3. The circuit of claim 2 wherein the flip-flops are connected to operate switches to switch passive elements into and out of the circuit.

4. A receiver for converting a plurality of CVSD bits to an analog voltage comprising:
   (a) a multiplying digital filter receiving the CVSD signal, filtering the signal digitally, and multiplying the signal by a control voltage;
   (b) a syllabic filter; and
   (c) a rule logic circuit connected to the multiplying digital filter and to the syllabic filter, the rule logic circuit generating a control signal in response to the plurality of CVSD bits of the same logic and controlling the syllabic filter to produce the control voltage.

* * * * *